(12) United States Patent
Faivre

(10) Patent No.: US 10,161,787 B2
(45) Date of Patent: Dec. 25, 2018

(54) SECURING A LIGHT MODULE COMPRISING A LASER SOURCE

(71) Applicant: VALEO VISION, Bobigny (FR)

(72) Inventor: Arnaud Faivre, Bobigny (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 15/618,953

(22) Filed: Jun. 9, 2017

(65) Prior Publication Data

US 2017/0356794 A1    Dec. 14, 2017

(30) Foreign Application Priority Data

Jun. 9, 2016 (FR) ...................................... 16 55314

(51) Int. Cl.
*H01S 5/068* (2006.01)
*G01J 1/04* (2006.01)
(Continued)

(52) U.S. Cl.
CPC ............. *G01J 1/0425* (2013.01); *F21S 41/16* (2018.01); *F21S 41/176* (2018.01); *F21S 45/70* (2018.01); *G01J 1/0488* (2013.01); *G01J 1/18* (2013.01); *H01S 3/0007* (2013.01); *H01S 5/02296* (2013.01); *H01S 5/06825* (2013.01); *H05B 33/089* (2013.01); *F21V 9/30* (2018.02); *F21V 23/0457* (2013.01); *F21Y 2115/30* (2016.08); *G01J 2001/0276* (2013.01); *G01J 2001/0285* (2013.01); *G01J 2001/4247* (2013.01); *G01J 2001/446* (2013.01); *H01S 5/0683* (2013.01);
(Continued)

(58) Field of Classification Search
None
See application file for complete search history.

(56) References Cited

U.S. PATENT DOCUMENTS 8,937,557 B2    1/2015  Loveland et al.
2005/0011867 A1*  1/2005  Okuda ................. B23K 26/032
                                                219/121.63
(Continued)

FOREIGN PATENT DOCUMENTS

EP         2 998 789 A1    3/2016

OTHER PUBLICATIONS

French Preliminary Search Report dated Mar. 9, 2017 in French Application 16 55314 filed on Jun. 9, 2016 (with English Translation of Categories of Cited Documents).
(Continued)

*Primary Examiner* — Chad H Smith
(74) *Attorney, Agent, or Firm* — Oblon, McClelland, Maier & Neustadt, L.L.P.

(57) ABSTRACT

The invention relates to a light module including a laser source capable of emitting a coherent light beam of given wavelength, a first sensor capable of picking up a first light signal of a wavelength lying in a first band of wavelengths centered around the given wavelength and a second sensor capable of picking up a second light signal of a wavelength lying in a second band of wavelengths centered around a wavelength distinct from the given wavelength. In particular, the light module includes a detection module capable of comparing at least one value that is a function of the signals to a threshold value and of commanding the stopping of the laser source as a function of the comparison.

19 Claims, 6 Drawing Sheets

(51) Int. Cl.
*H01S 3/00* (2006.01)
*H05B 33/08* (2006.01)
*F21S 41/16* (2018.01)
*F21S 41/176* (2018.01)
*F21S 45/70* (2018.01)
*G01J 1/18* (2006.01)
*H01S 5/022* (2006.01)
*F21Y 115/30* (2016.01)
*G01J 1/42* (2006.01)
*G01J 1/02* (2006.01)
*G01J 1/44* (2006.01)
*F21V 23/04* (2006.01)
*F21V 9/30* (2018.01)
*H01S 5/0683* (2006.01)
*H01S 5/323* (2006.01)

(52) U.S. Cl.
CPC ......... *H01S 5/32341* (2013.01); *Y02B 20/341* (2013.01)

(56) References Cited

U.S. PATENT DOCUMENTS

| | | | |
|---|---|---|---|
| 2011/0116520 A1* | 5/2011 | Krijn | H01S 5/005 372/29.02 |
| 2016/0033112 A1 | 2/2016 | Weissenberger | |
| 2016/0069819 A1 | 3/2016 | Ichikawa | |

OTHER PUBLICATIONS

"RGB color sensor integrated in small and thin package" SI0917-35GT, SI photodiode, Hamamatsu Photonics, https://www.hamamatsu.com/resources/pdf/ssd/sI0917-35gtkspdI078e.pdf, Feb. 29, 2016, pp. 4.

* cited by examiner

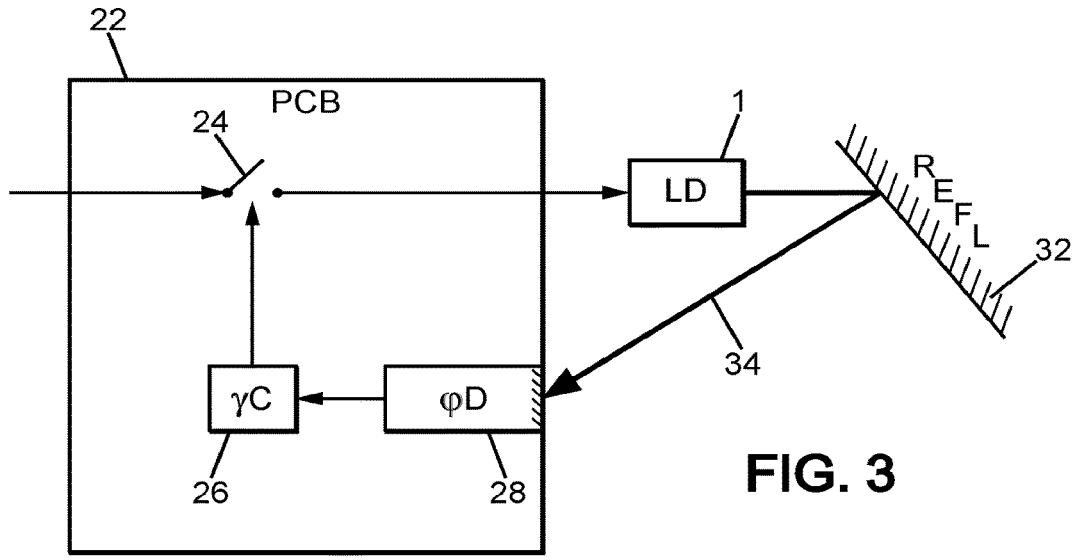
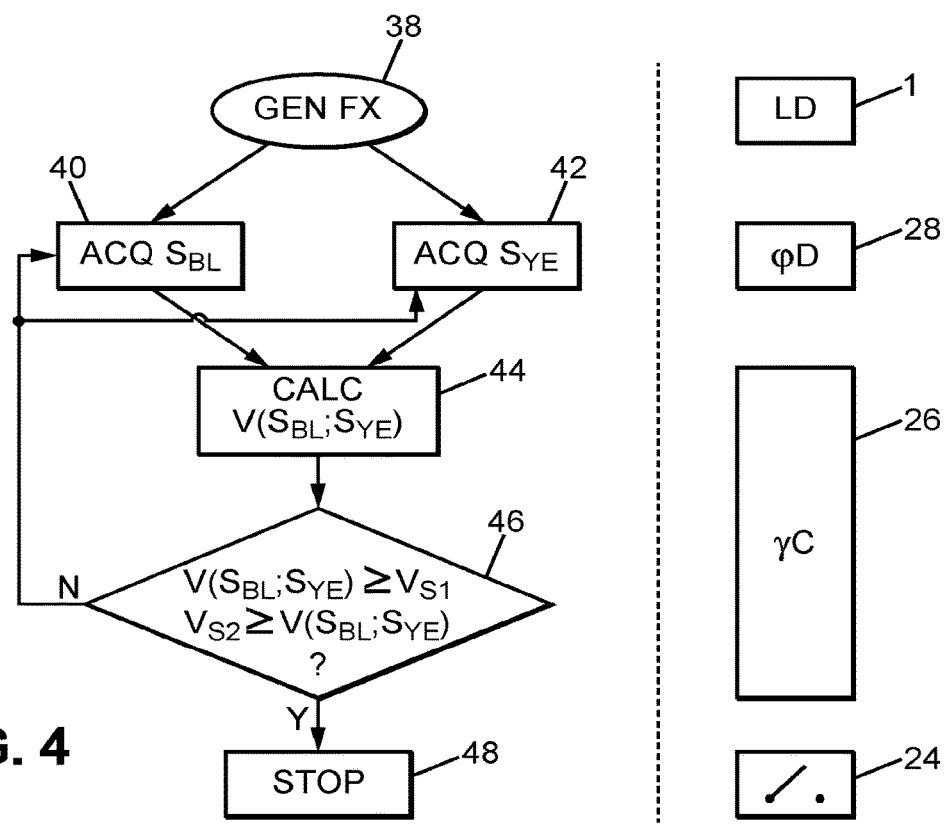

SECURING A LIGHT MODULE COMPRISING A LASER SOURCE

BACKGROUND

The present invention belongs to the field of the light modules comprising a laser source. In particular, it relates to a device and a method for securing such a light module.

The present invention is particularly advantageous when it is implemented in a light-emitting device incorporated in a vehicle and comprising the light module.

A "light-emitting device" should be understood to be any device capable of emitting light. For example, a headlight or a light of a vehicle, a pocket lamp, a lamp incorporated in the interior of a vehicle, a nightlight incorporated in a seat of a train wagon, a component of a television screen or even a high-intensity searchlight on a coastguard boat are examples of light-emitting devices. A vehicle should be understood to be any type of device capable of moving, such as a car, a truck, a scooter, an airplane, a train or even a sled.

A "light module" should be understood to be any sub-device of the light-emitting device from which the light is emitted. Thus, the light module can comprise a light source.

A "laser source" should be understood to be any device capable of producing a spatially and temporally coherent radiation based on the laser effect. Hereinafter in the present description, the terms "laser source" and "laser" are used indifferently.

Depending on the power and the emission wavelength of the laser, the latter can represent a real hazard to sight and cause irreparable burns to the retina.

Nevertheless, the use of lasers is desirable in many products intended for the public. For example, in the motor vehicle industry, the lights and/or headlights of the vehicles comprising lasers are sought after for their performance levels (range, form of the beam for example) and their esthetic appearance.

FIGS. 1, 2A and 2B represent a known source module 1 comprising a processing module 8 capable of securing a laser beam emitted by a laser source 2. The source module 1 typically has a cylindrical form.

In particular, a laser beam 18 is generated by the laser source 2 that is then focused by a lens 6 after having passed through a flat glass 4. At the output of the lens 6, the beam is coherent, typically in a wavelength in the blue. At this stage, and through its coherence, the beam is dangerous. In effect, such a beam is called class 4, in the French standard NF EN 60825-1, i.e. the most dangerous class.

To make it possible to use such a laser beam in consumer applications, it has been proposed to process the laser beam 18 through a processing module 8.

The processing module 8 comprises a ceramic ring 10 having a reflecting coating, a pad 12 of photoluminescent material and a protective glass 14. The photoluminescent material is for example of YaG, yttrium-aluminum grenate, type.

As detailed in FIG. 2A, when the beam 18 which, on leaving the lens, is of class 4 and coherent, arrives on the pad 12, some of the signals forming the beam are converted to have a wavelength in the yellow. These converted signals are added together with the signals which have not been converted so that the resulting beam is no longer coherent. Thus, the beam leaving the processing module is no longer class 4 and can be used for a consumer application.

However, in some applications such as the motor vehicle industry, the processing module can be subject to impacts or other deteriorations. In this case, the pad 12 of phosphor can be damaged and show deteriorations 16, such as cracks or breaks. In this situation, illustrated in FIG. 2B, some beams like the beam 20A can still be correctly processed by the processing module 8. However, other beams cannot be correctly processed and therefore diffuse a very dangerous coherent laser beam 20B.

BRIEF SUMMARY

Other types of deteriorations, less visible and therefore more difficult to detect, can occur. For example, a vehicle comprising this type of light module and being frequently subjected to particular weather conditions (prolonged extreme hot or cold) or to low but very frequent impacts, can exhibit a slow degradation of the processing module 8. It is particularly difficult to detect this type of slow deterioration.

There is therefore a need to reliably and effectively detect all types of deteriorations of light modules incorporating a laser source.

The present invention improves the situation.

To this end, a first aspect of the invention relates to a light module comprising:
- a laser source capable of emitting a coherent light beam of given wavelength;
- a first sensor capable of picking up a first light signal of a wavelength lying in a first band of wavelengths centered around said given wavelength;
- a second sensor capable of picking up a second light signal of a wavelength lying in a second band of wavelengths centered around a wavelength distinct from said given wavelength;

characterized in that the light module comprises a detection device capable of comparing at least one value that is a function of said signals to a threshold value and of commanding the stopping of the laser source as a function of said comparison.

A deterioration of the light source leading to the releasing of a dangerous laser beam can thus be detected. In particular, a deterioration of the pad 12 can easily be detected by the first and second sensors.

Furthermore, the presence of two sensors capable of detecting signals of different wavelengths allows for a fine detection of a deterioration of the light module. In particular, the slow detections are detected more rapidly when data on signals of several wavelengths are available.

In one embodiment, the first and second sensors are included in a photodiode. For example, the photodiode can comprise an RBG (red, green, blue) sensor. One type of RGB sensor can comprise a sensor equipped with different filters, typically red, green and blue.

The use of the photodiode reduces the bulk of the light module through the reduced dimensions of such a photodiode. The grouping together of the sensors further simplifies the connections between these sensors and the detection device.

In another embodiment, at least one sensor emits a digital signal relating to the light signal picked up. Thus, a signal that can easily be interpreted is directly available at the output of said at least one sensor. Furthermore, the accuracy of the data received by the detection device is improved. The accuracy is in particular improved by digitizing the signals at the sensor level because the information transmitted by digital signals is less likely to be modified by transmission errors between sensor and detection device than analog signals.

In one embodiment, the detection device further comprises:

a filtering module arranged to perform a filtering of the digital signal over a predetermined interval, the value that is a function of said signals being determined as a function of said filtering.

In one embodiment, the filtering of the signal is an average of the digital signal over the predetermined interval. As a variant, the filtering can be a weighting or any other type of operation over the predetermined interval.

The predetermined interval corresponds for example to the last ten values received from the sensors, in the case where discrete values are required.

The filtering module substantially reduces the incidence of occasional sensor errors. In effect, it is possible, occasionally, for a value above or below the different thresholds to be detected because of an error in the acquisition of this value. If this value is not averaged by other values, a detection of deterioration of the laser source will be wrongly detected.

In another embodiment, the value that is a function of said signals is a value characteristic of a light intensity of the first signal or of the second signal. Such a direct detection allows for the rapid detection of a deterioration of the source and/or of a violent movement of the processing module intended to filter the dangerous laser beams.

In one embodiment, the value that is a function of said signals is a value characteristic of a ratio between the second signal and the first signal.

The inclusion of a ratio between signals of different wavelengths allows for a fine tracking of deviations from the spectrum of the radiations forming the beam emitted by the light module. The variation of these ratios can in particular indicate a slow deterioration of the light module, and in particular of the processing module.

In effect, to return to the example given above with reference to FIGS. 1 and 2B, a slow degradation of the pad 12 of photoluminescent material can have the consequence of reducing the partial filtering into signals having a wavelength in the yellow. Thus, the portion of signals in the yellow being added together with the signals in the blue is reduced gradually with the degradation of the photoluminescent material.

This phenomenon causes the incoherence introduced by the addition with signals in the yellow to be reduced. The gradual increase in coherence in the blue makes the beam emitted dangerous.

Furthermore, only taking into consideration the light intensity of the signals, in the wavelengths concerned, taken individually, does not make it possible to detect a variation of the coherence of the overall beam emitted as output. In effect, it is possible for the total intensity of the signal in the blue to remain constant or to increase only a little but for the share of this signal in the overall beam emitted to increase substantially. In this situation, the overall beam becomes coherent, and therefore dangerous, without the intensity in the blue having increased much.

It is therefore particularly advantageous to take account of a ratio between the signals to detect a slow deterioration.

In another embodiment, the detection device further comprises a self-diagnostic module arranged to compare said at least one value that is a function of said signals to an operating threshold value. The securing of the light module is thus improved because a failure of the detection module can be detected.

In one embodiment, the detection device is also configured to perform the steps of:

acquisition of a first light signal of a wavelength lying in a first band of wavelengths centered around said given wavelength;

acquisition of a second light signal of a wavelength lying in a second band of wavelengths centered around a wavelength distinct from said given wavelength;

comparison by a detection module of at least one first value that is a function of said signals to a first threshold value;

stopping of the laser source as a function of said comparison.

In another embodiment, the laser source is stopped if said first value that is a function of said signals is above the first threshold value.

In one embodiment, the detection device is also configured to perform the steps of:

comparison of at least one second value that is a function of said signals to a second threshold value;

detection of a malfunctioning of the detection module if said second value that is a function of said signals is below the second threshold value.

In one embodiment, the first and/or the second value that is a function of said signals is a value characteristic of a light intensity of the first signal or of the second signal. In another embodiment, the first and/or the second value that is a function of said signals is a value characteristic of a ratio between the second signal and the first signal.

A second aspect of the invention relates to a method for processing signals generated by a laser source included in a light module, the laser source being capable of emitting a coherent light beam of given wavelength, the method comprising the steps of:

acquisition of a first light signal of a wavelength lying in a first band of wavelengths centered around said given wavelength;

acquisition of a second light signal of a wavelength lying in a second band of wavelengths centered around a wavelength distinct from said given wavelength;

comparison by a detection module of at least one first value that is a function of said signals to a first threshold value;

stopping of the laser source as a function of said comparison.

In one embodiment of the second aspect of the invention, the laser source is stopped if said first value that is a function of said signals is above the first threshold value.

In another embodiment of the second aspect of the invention, the method further comprises, after the step of acquisition by the second sensor, the steps of:

comparison of at least one second value that is a function of said signals to a second threshold value;

detection of a malfunctioning of the detection module if said second value that is a function of said signals is below the second threshold value.

In one embodiment of the second aspect of the invention, the first and/or the second value that is a function of said signals is a value characteristic of a light intensity of the first signal or of the second signal.

In another embodiment of the second aspect of the invention, the first and/or the second value that is a function of said signals is a value characteristic of a ratio between the second signal and the first signal.

A third aspect of the invention relates to a computer program comprising instructions for implementing the method according to the second aspect of the invention, when these instructions are executed by a processor.

BRIEF DESCRIPTION OF THE DRAWINGS

Other features and advantages of the invention will become apparent on studying the following detailed description, and the attached drawings in which:

FIG. 3 illustrates the light module according to the invention, in an embodiment;

FIG. 4 is a diagram of the method according to the invention, in an embodiment;

DETAILED DESCRIPTION

Figure 1:
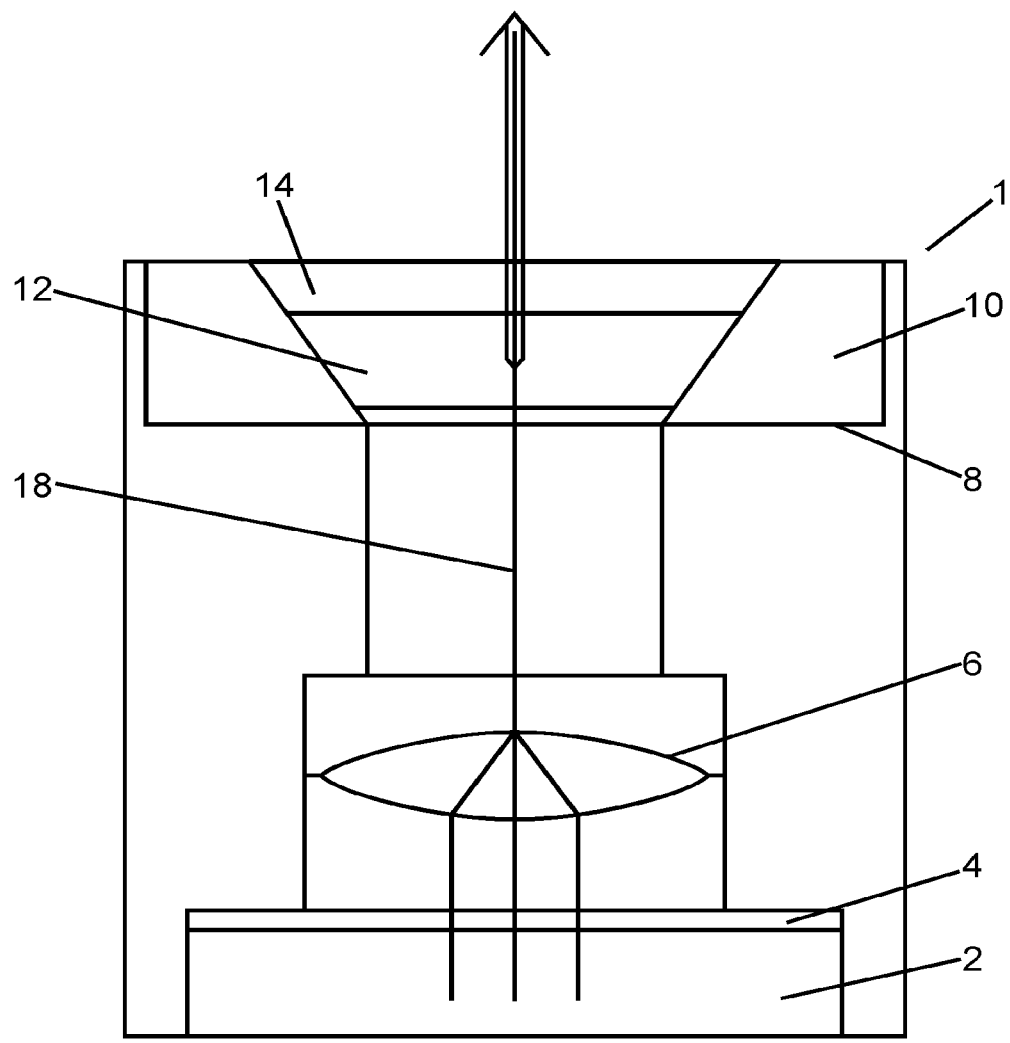
FIG. 1 illustrates a known light module.

The light module according to the invention is described hereinbelow in its nonlimiting application to a light-emitting device of a motor vehicle. Other applications such as a device according to the invention used as headlight or interior decoration of a motor vehicle, as Christmas tree lights or even as signaling panel can also be envisaged.

The module is for example configured to implement one or more photometric functions.

A photometric function is for example a lighting and/or signaling function visible to the human eye. Note that these photometric functions may be the subject of one or more regulations establishing requirements of colorimetry, of intensity, of spatial distribution according to a so-called photometric grid, or even of ranges of visibility of the light emitted.

A light-emitting device comprising the module according to the invention is for example a lighting device and then forms a vehicle headlight. It is then configured to implement one or more photometric functions for example chosen from a dipped beam function called "low beam function" (UN-ECE regulations 87 and 123), a position light function (UNECE regulation 007), a so-called "high beam function" (UNECE regulation 123), a fog light function (UNECE regulations 019 and 038).

Alternatively, the device is a signaling device intended to be arranged at the front or the rear of the vehicle.

When it is intended to be arranged at the front, these photometric functions include a direction change indication function (UNECE regulation 006), a daytime running light function known by the acronym DRL (UNECE regulation 087), a front light signature function.

When it is intended to be arranged at the rear, these photometric functions include a reversing indication function (UNECE regulation 023), a stop function (UNECE regulation 007), a fog light function (UNECE regulations 019 and 038), a direction change indication function (UNECE regulation 006), a rear light signature function.

Alternatively, the device is provided for lighting the interior of a vehicle and is then intended to emit light mainly in the interior of the vehicle.

There now follows a description, with reference to FIGS. 3 and 4 of the device and method for processing signals generated by a laser source included in a light module, according to an embodiment of the invention.

The light module, here comparable to the light-emitting device, comprises an integrated circuit 22 on which there is a switch 24 controlled by a microcontroller 26 itself receiving data from a photodiode 28. The photodiode 28 can comprise an RGB (red, green, blue) sensor. One type of RGB sensor can comprise a sensor equipped with different filters, typically red, green and blue. A possible architecture of the microcontroller 26 is detailed hereinbelow with reference to FIG. 7.

The components 24, 26 and 28 can also be included in different integrated circuits, or not be included in integrated circuits.

The light module further comprises the source module 1 described above with reference to FIGS. 1 to 2B. The module 1 is supplied with energy via the switch 24, so that the module 1 is not switched on if the switch 24 is open. The switch can take various forms and is not limited to a mechanical switch of an electrical circuit.

In particular, the switch can be incorporated in the microcontroller 26. In this situation, the operation of the switch can consist in the transmission of an operation or non-operation instruction from the microcontroller 26 to the module 1.

The source module 1 emits a beam 34 which is reflected on a reflector 32 to be directed toward the photodiode 28. The beam emitted at the output of the module 1 can typically be partially reflected by the reflector 32 for a part of the beam to be projected onto the photodiode and for the rest of the beam to be used to ensure the signaling and/or projection function of the light module. The photodiode 28 can also be placed at the output of the module 1 without there being a reflector provided.

Thus, the light module comprises a laser source, included in the module 1, capable of emitting a coherent light beam of given wavelength, a first sensor capable of picking up a first light signal of a wavelength lying in a first band of wavelengths centered around said given wavelength and a second sensor capable of picking up a second light signal of a wavelength lying in a second band of wavelengths centered around a wavelength distinct from said given wavelength. The first and the second sensor are typically included in the photodiode 28.

The light module comprises a detection device, typically included in or consisting of the microcontroller 26, capable of comparing at least one value that is a function of said signals to a threshold value and of commanding the stopping of the laser source as a function of said comparison.

The method is now described with reference to FIG. 4. In this figure, the steps of the method are schematically represented in the left-hand part and an example of modules/devices responsible for performing these steps is given in the right-hand part of the figure.

Thus, a beam FX of coherent light of given wavelength is generated by the source module 1 in the step 38.

In a step 40, a first light signal $S_{BL}$ of the wavelength lying in a first band of wavelengths centered around said given wavelength is acquired by the photodiode 28. For example, the given wavelength can correspond to the blue color, i.e. substantially between 470 and 490 nm. The first band centered around this wavelength is for example 450 to 500 nm.

In a step 42, a second light signal $S_{YE}$ of a wavelength lying in a second band of wavelengths centered around a wavelength distinct from said given wavelength is acquired. For example, the distinct wavelength can correspond to the yellow color, i.e. substantially between 574 and 582 nm. The second band centered around this wavelength is for example 555 to 586 nm.

The sensors can be configured to incorporate an analog-digital converter, or ADC, for the analog signals acquired to be directly converted into binary signals.

Furthermore, the sensors and/or the microcontroller 26 can comprise a filtering module arranged to perform an averaging or a weighting of the digital signals acquired by the sensors over a predetermined interval. The predetermined interval corresponds for example to the last ten values received from the sensors, in the case where discrete values are acquired.

A first value $V(S_{BL}; S_{YE})$ that is a function of the first and second signals, and/or of the abovementioned filtered value, is then calculated in the step 44. A second value, also a function of the first and second signals, can also be calculated in the step 44.

The first and/or the second value can be a value characteristic of a light intensity of the first signal or of the second signal. Calculation examples are given below:

$$V(S_{BL};S_{YE})=k.I_{MAX}(S_{BL})$$

$$V(S_{BL};S_{YE})=k.I_{MOY}(S_{BL})$$

$$V(S_{BL};S_{YE})=k.I_{MAX}(S_{YE})$$

$$V(S_{BL};S_{YE})=k.I_{MOY}(S_{YE})$$

$$V(S_{BL};S_{YE})=k.(I_{MOY}(S_{BL})+I_{MOY}(S_{YE}))/2$$

In another embodiment, the first and/or the second value that is a function of said signals is a value characteristic of a ratio between the second signal and the first signal. Calculation examples are given below:

$$V(S_{BL};S_{YE})=k.I_{MAX}(S_{YE})/I_{MAX}(S_{BL})$$

$$V(S_{BL};S_{YE})=k.I_{MAX}(S_{BL})/I_{MAX}(S_{YE})$$

$$V(S_{BL};S_{YE})=k.I_{MOY}(S_{YE})/I_{MOY}(S_{BL})$$

$$V(S_{BL};S_{SE})=k.I_{MOY}(S_{BL})/I_{MOY}(S_{YE})$$

With $I_{MAX}$ and $I_{MOY}$ corresponding respectively to the maximum light intensity and to the average light intensity (for example over 1 second), and k is a real number, k=1 in one embodiment.

These intensities can for example be expressed in candela. These intensities can also correspond to a power per unit of surface area on which the beam is received, they can then be expressed in $\mu W/cm^2$.

Once $V(S_{BL}; S_{YE})$ is calculated, this value is compared to a threshold value $V_{S1}$ in the step 46. The threshold value is determined for the situation where $V(S_{BL}; S_{YE}) \geq V_{S1}$ to reflect a malfunctioning of the source module 1, and in particular a deterioration of the processing module 8.

Figure 5A:
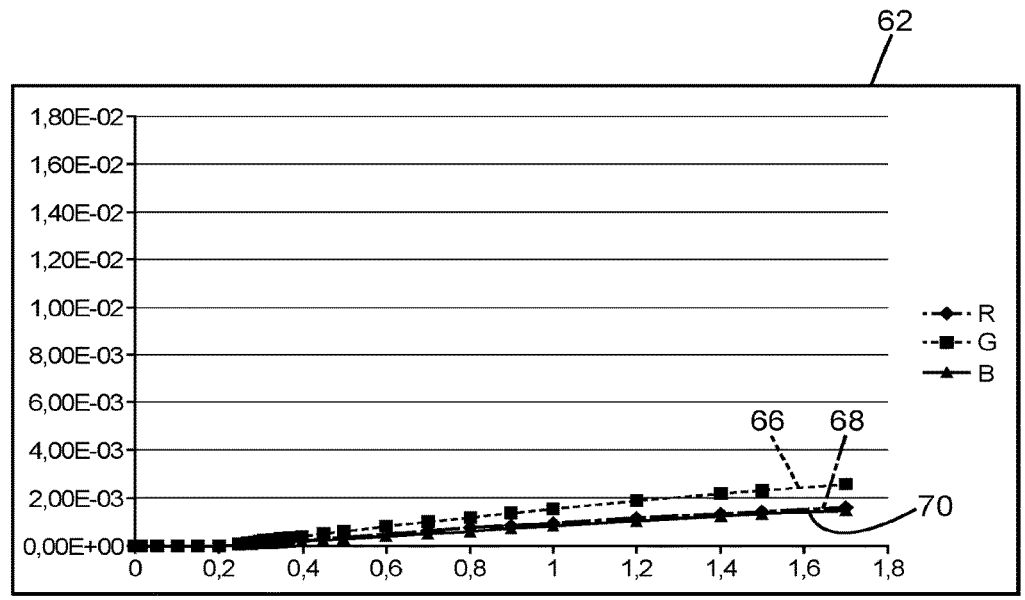
FIGS. 5A and 5B illustrate the response of a laser source according to an embodiment of the invention.
Figure 5B:
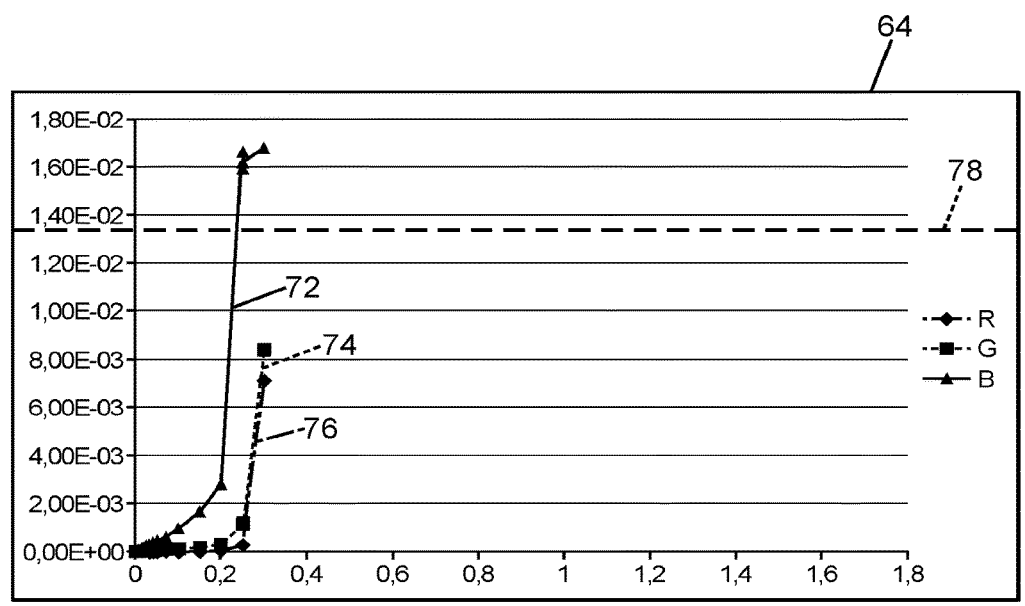
Figure 6:
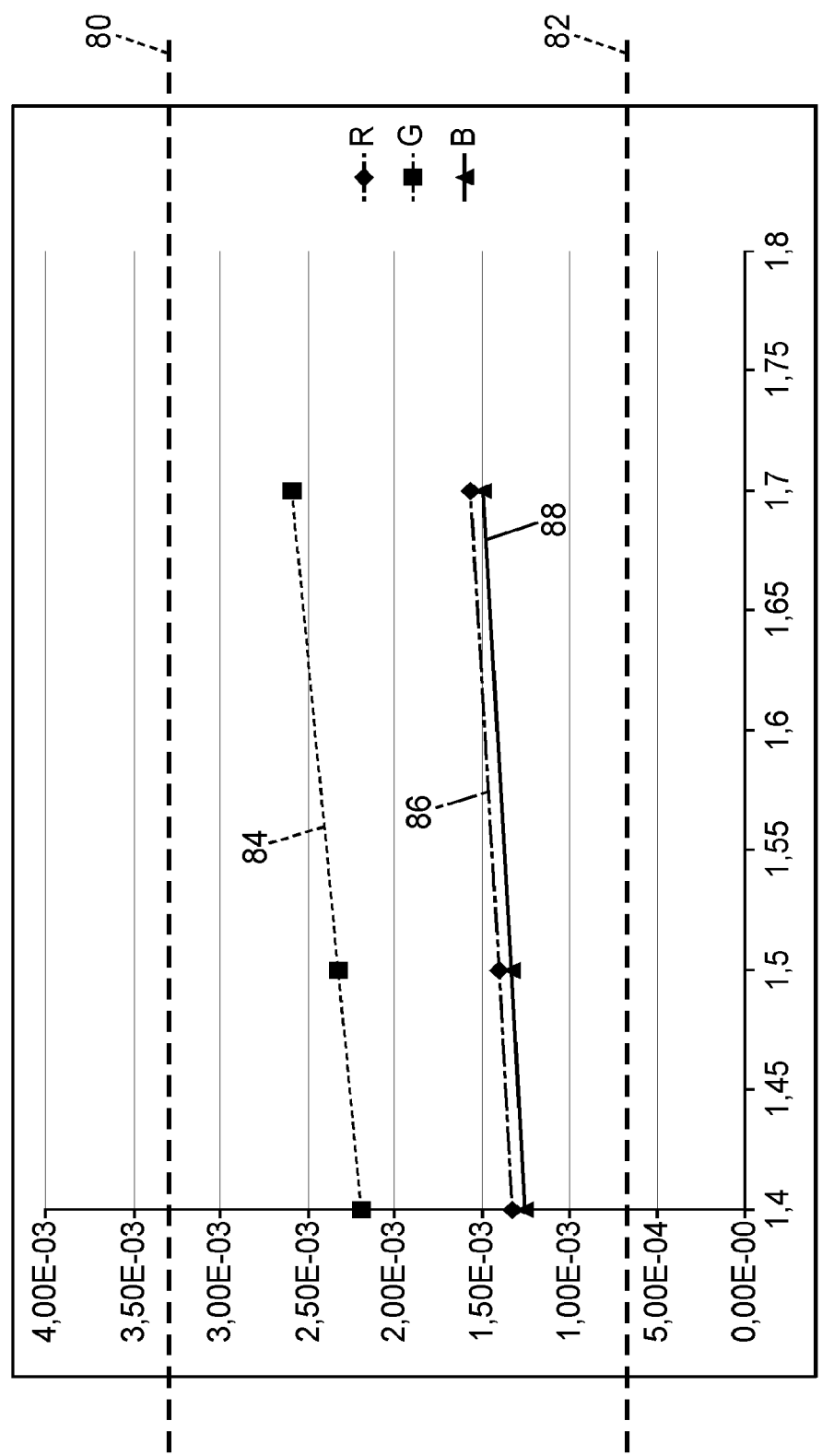
FIG. 6 illustrates the response of a laser source according to another embodiment of the invention.

For example, and as is illustrated in FIGS. 5A, 5B, and 6, $V_{S1}$ can be substantially equal to $1.35E-02\ \mu W/cm^2$, as illustrated in reference 78.

FIGS. 5A and 5B illustrate the curves representative of $V(S_{BL}; S_{GR}; S_{RD})$. $S_{GR}$ corresponds to a light signal in the green and $S_{RD}$ to a light signal in the red in the case where the source module 1 is operating normally, on the left-hand part 62, and in the case where it has deteriorated, in the right-hand part 64. There are therefore, here, three different values of $V(S_{BL}; S_{GR}; S_{RD})$ which are taken into account, each being compared with $V_{S1}$. The values of $V(S_{BL}; S_{GR}; S_{RD})$ are expressed in $\mu W/cm^2$, on the y axis, versus the power supply current in amperes of the source module 1, on the x axis.

In this example, the curves 66, 68 and 70 respectively represent a light intensity characteristic of the signal in the green, the red and the blue. Similarly, on the right-hand part, the curves 74, 76 and 72 respectively represent a light intensity characteristic of the signal in the green, the red and the blue.

On the right-hand part 64, the value of $V(S_{BL}; S_{GR}; S_{RD})$ corresponding to the blue increases greatly above 0.2 amperes so that it exceeds the threshold $V_{S1}$. This situation corresponds to the case where a deterioration of the source module 1 has the effect of allowing coherent beams which are potentially dangerous to pass.

In the step 46, the value or values of $V(S_{BL}; S_{YE})$ can also be compared to a second threshold value $S_{S2}$, reference 82 in FIG. 6. The reference 80 corresponds to $V_{S1}$ in FIG. 6.

In particular, a malfunction is detected if $V(S_{BL}; S_{YE}) \leq V_{S2}$. This situation corresponds to the case where there is a fault in the detection device, typically at the level of the microcontroller 26, the photodiode 28 and/or the source module 1. In effect, if the value of $V(S_{BL}; S_{YE})$ is below a threshold, that means that the source module is no longer emitting correctly or that the first and/or second signals are no longer correctly acquired by the photodiode and/or processed by the microcontroller 26. These malfunction self-detection functionalities are typically included in a self-diagnostic module, for example incorporated in the microcontroller 26.

The case has been described above in which the same value $V(S_{BL}; S_{YE})$ is used for the comparison to $V_{S1}$ and for the comparison to $V_{S2}$. In one embodiment, different values of $V(S_{BL}; S_{YE})$ are used for each of the comparisons. For example, the value of $V(S_{BL}; S_{YE})$ used for the comparison to $V_{S1}$ is $k.I_{MAX}(S_{YE})/I_{MAX}(S_{BL})$ and the value of $V(S_{BL}; S_{YE})$ used for the comparison to $V_{S2}$ is $k.I_{MAX}(S_{BL})$.

If, in the step 46, no overshoot of the thresholds $V_{S1}$ and $V_{S2}$ is detected, the method repeats the steps 40 and 42 for new signals to be picked up.

If, in the step 46, an overshoot of the thresholds $V_{S1}$ and/or $V_{S2}$ is detected, the method continues with the stop step 48. In this step 48, the microcontroller sends an instruction to stop emitting to the source module 1, either by opening the power supply switch 24, or by directly sending a stop instruction to the source module 1. The light module is secured and the source module 1 no longer sends damaging beams.

An alert message, detailing for example whether the alert has been generated because of a maximum or minimum threshold overshoot, can also be generated in the step 48.

Figure 7:
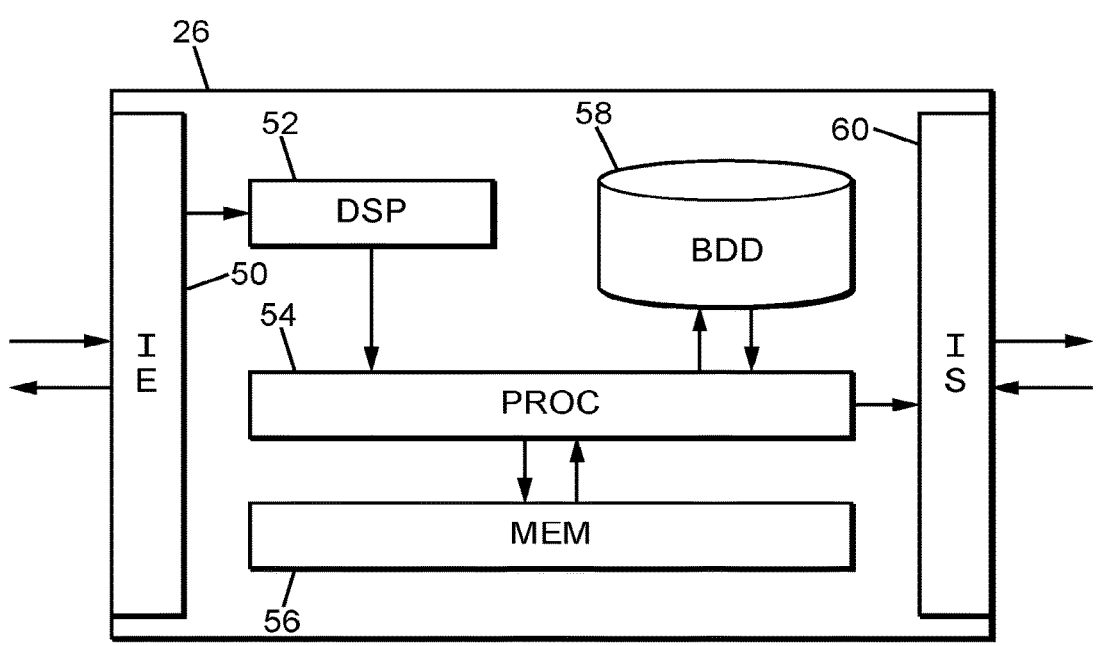
FIG. 7 illustrates a microcontroller according to an embodiment of the invention.

The detail of a microcontroller 26, from which the steps are implemented the steps of the method described with reference to FIG. 3, notably, is here described with reference to FIG. 7.

This microcontroller 26 can take the form of a housing comprising printed circuits, an electronic chip, a programmable circuit such as an FPGA, for "field programmable gate array", or any type of computer or of any type of subpart of the printed circuit 22.

The microcontroller 26 comprises a random access memory 56 for storing instructions for the implementation by a processor 54 of the steps of the method described with reference to FIG. 3, in particular. The device also comprises a mass memory 58 for the storage of data intended to be retained after the implementation of the method, for example for establishing statistics on the history of the detections.

The microcontroller 26 can also comprise a digital signal processor (DSP) 52. This DSP 52 for example receives the data from the photodiode to format, demodulate and amplify these data, as is known per se.

The microcontroller 26 also comprises an input interface 50 for the reception of data such as the data received from the photodiode 28, input signals received from a user, operating parameters, etc. The microcontroller 26 also comprises an output interface 60 in particular for transmitting data such as the stop instructions for the source module 1 or the alert messages.

The present invention is not limited to the embodiments described above as examples; it extends to other variants.

Thus, the invention has been described above with examples of signals in the blue, the yellow, the red and the green. The invention can also be implemented with signals in all the colors of the visible spectrum. Furthermore, as mentioned in the embodiment described with reference to FIGS. 5A, 5B, and 6, it is possible to make the comparisons to the threshold values for several values of $V(S_{BE}; S_{YE})$. For example, the comparison can be performed with a value of $V(S_{BL}; S_{YE})$ for each signal acquired.

Figure 2A:
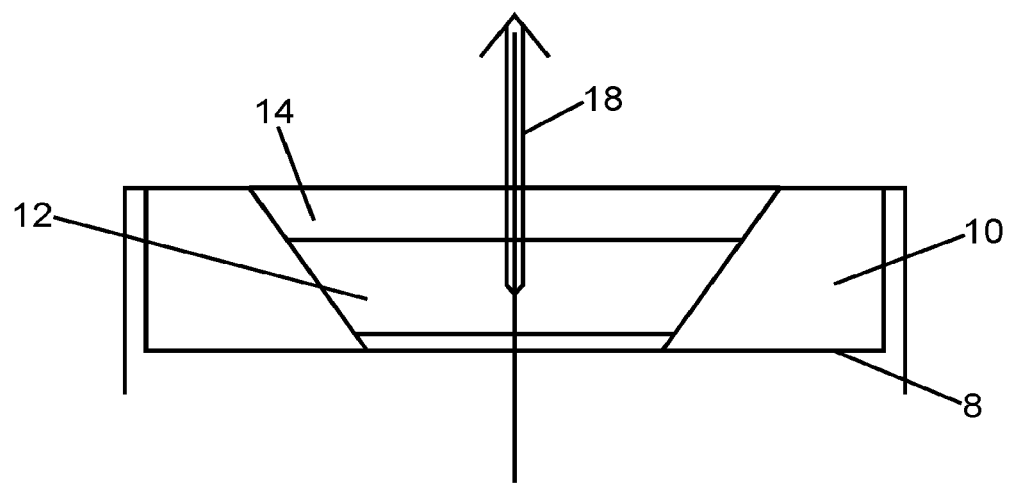
FIG. 2A illustrates a known processing module capable of filtering a dangerous laser beam.
Figure 2B:
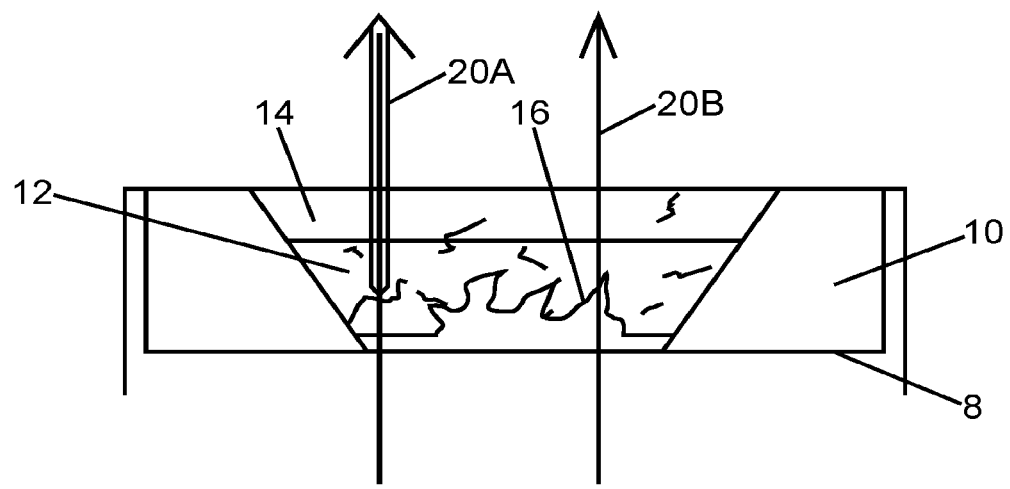
FIG. 2B illustrates the known processing module when it has deteriorated.

In addition, one possible architecture of components of the light module according to the invention has been described, in particular in FIG. 2. The invention can also be implemented with any other distribution of components. The light module can for example comprise several photodiodes, one photodiode incorporated in the microcontroller or even several source modules.

The invention claimed is:

1. A light module comprising:
    a laser source capable of emitting a coherent light beam of a given wavelength;
    a processing module comprising a photoluminescent material to convert the coherent light beam into an emitted light beam that is incoherent to be emitted from the light module;
    a first sensor capable of picking up a first light signal of a wavelength lying in a first band of wavelengths centered around said given wavelength;
    a second sensor capable of picking up a second light signal of a wavelength lying in a second band of wavelengths centered around a wavelength distinct from said given wavelength; and
    a detection device capable of comparing at least one first value that is a function of said first and second light signals to a first threshold value and of commanding a stopping of the laser source when the at least one first value is higher than the first threshold value, the first threshold value being determined to indicate a deterioration of the photoluminescent material such that the emitted light beam is incoherent,
    the detection device being capable of comparing a second value that is a light intensity of a wavelength, selected from the wavelength lying in the first band of wavelengths and the wavelength lying in the second band of wavelengths, to a second threshold value that is a light intensity threshold for the selected wavelength and of commanding the stopping of the laser source when the second value is lower than the second threshold value.

2. The light module according to claim 1, wherein the first and second sensors are included in a photodiode.

3. The light module according to claim 2, wherein at least one sensor emits a digital signal relating to a light signal picked up.

4. The light module according to claim 2, wherein the value that is a function of said first and second light signals is a value characteristic of a light intensity of the first light signal or of the second light signal.

5. The light module according to claim 2, wherein the value that is a function of said first and second light signals is a value characteristic of a ratio between the second light signal and the first light signal.

6. The light module according to claim 2, wherein the detection device comprises:
    a self-diagnostic module arranged to compare said at least one first value that is a function of said first and second light signals to an operating threshold value.

7. The light module according to claim 1, wherein at least one sensor emits a digital signal relating to a light signal picked up.

8. The light module according to claim 7, wherein the detection device further comprises:
    a filtering module arranged to perform a filtering of the digital signal over a predetermined interval, the at least one first value that is a function of said first and second light signals being determined as a function of said filtering.

9. The light module according to claim 1, wherein the at least one first value that is a function of said first and second light signals is a value characteristic of a light intensity of the first light signal or of the second light signal.

10. The light module according to claim 1, wherein the at least one first value that is a function of said first and second light signals is a value characteristic of a ratio between the second light signal and the first light signal.

11. The light module according to claim 1, wherein the detection device comprises:
    a self-diagnostic module arranged to compare said at least one first value that is a function of said first and second light signals to an operating threshold value.

12. The light module according to claim 1, wherein the at least one first value that is a function of said first and second light signals is different than the second value that is a light intensity of a wavelength.

13. The light module according to claim 1, wherein:
    the first band of wavelengths corresponds to a blue color,
    the second band of wavelengths corresponds to a yellow color,
    the at least one first value that is a function of said first and second light signals is a value characteristic of a ratio of the blue color to the yellow color in said first and second light signals, and
    the first threshold value is the ratio of the blue color to the yellow color that indicates a deterioration of the photoluminescent material such that the emitted light beam is coherent.

14. A method for processing signals generated by a laser source included in a light module, the light module including a processing module, the laser source being capable of emitting a coherent light beam of a given wavelength, and the processing module comprising a photoluminescent material to convert the coherent light beam into an emitted light beam that is incoherent to be emitted from the light module, the method comprising:
    acquiring a first light signal of a wavelength lying in a first band of wavelengths centered around said given wavelength;
    acquiring a second light signal of a wavelength lying in a second band of wavelengths centered around a wavelength distinct from said given wavelength;

comparing by a detection module at least one first value that is a function of said first and second light signals to a first threshold value, the first threshold value being determined to indicate a deterioration of the photoluminescent material such that the emitted light beam is incoherent;

stopping the laser source when the at least one first value is higher than the first threshold value;

comparing by the detection module a second value that is a light intensity of a wavelength, selected from the wavelength lying in the first band of wavelengths and the wavelength lying in the second band of wavelengths, to a second threshold value that is a light intensity threshold for the selected wavelength; and stopping the laser source when the second value is lower than the second threshold value.

15. The method according to claim 14, wherein the first value that is a function of said first and second light signals is a value characteristic of a light intensity of the first light signal or of the second light signal.

16. The method according to claim 14, wherein the first value that is a function of said first and second light signals is a value characteristic of a ratio between the second light signal and the first light signal.

17. A computer program comprising instructions for implementing the method according to claim 14, when these instructions are executed by a processor.

18. The method according to claim 14, wherein the at least one first value that is a function of said first and second light signals is different than the second value that is a light intensity of a wavelength.

19. The method according to claim 14, wherein:

the first band of wavelengths corresponds to a blue color, the second band of wavelengths corresponds to a yellow color, the at least one first value that is a function of said first and second light signals is a value characteristic of a ratio of the blue color to the yellow color in said first and second light signals, and the first threshold value is the ratio of the blue color to the yellow color that indicates a deterioration of the photoluminescent material such that the emitted light beam is coherent.

* * * * *